(12) United States Patent
Schricker et al.

(10) Patent No.: US 8,467,224 B2
(45) Date of Patent: Jun. 18, 2013

(54) DAMASCENE INTEGRATION METHODS FOR GRAPHITIC FILMS IN THREE-DIMENSIONAL MEMORIES AND MEMORIES FORMED THEREFROM

(75) Inventors: April D. Schricker, Palo Alto, CA (US); Mark H. Clark, Santa Clara, CA (US); Andy Fu, San Ramon, CA (US); Huiwen Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 159 days.

(21) Appl. No.: 12/421,405

(22) Filed: Apr. 9, 2009

(65) Prior Publication Data
US 2009/0257270 A1  Oct. 15, 2009

Related U.S. Application Data

(60) Provisional application No. 61/044,352, filed on Apr. 11, 2008.

(51) Int. Cl.
*H01L 45/00* (2006.01)
*G11C 11/21* (2006.01)

(52) U.S. Cl.
USPC .................. 365/148; 257/5; 257/E51.038

(58) Field of Classification Search
USPC ............... 257/1–5, 40, E45.001, E45.002, 257/E45.003, E51.011, E51.038, E51.039, 257/E51.04; 365/148
See application file for complete search history.

(56) References Cited

U.S. PATENT DOCUMENTS

| | | | |
|---|---|---|---|
| 5,305,519 A | 4/1994 | Yamamoto et al. | |
| 5,470,661 A | 11/1995 | Bailey et al. | |
| 5,563,762 A | 10/1996 | Leung et al. | |
| 5,637,373 A * | 6/1997 | Hayashi | 428/835.2 |
| 5,915,167 A | 6/1999 | Leedy | |
| 6,024,044 A | 2/2000 | Law et al. | |
| 6,031,287 A | 2/2000 | Harshfield | |
| 6,034,882 A | 3/2000 | Johnson et al. | |
| 6,066,399 A * | 5/2000 | Hirano et al. | 428/408 |
| 6,952,030 B2 | 10/2005 | Herner et al. | |
| 7,038,935 B2 | 5/2006 | Rinerson et al. | |
| 7,176,064 B2 | 2/2007 | Herner | |
| 7,345,296 B2 | 3/2008 | Tombler et al. | |
| 7,348,591 B2 | 3/2008 | Yamauchi et al. | |

(Continued)

FOREIGN PATENT DOCUMENTS

| | | |
|---|---|---|
| DE | 101 30 824 A1 | 10/2008 |
| EP | 1 892 722 A1 | 2/2008 |

(Continued)

OTHER PUBLICATIONS

Xu, U.S. Appl. No. 12/604,178, filed Oct. 22, 2009.

(Continued)

*Primary Examiner* — Douglas King
(74) *Attorney, Agent, or Firm* — Dugan & Dugan, PC

(57) ABSTRACT

In some aspects, a microelectronic structure is provided that includes (1) a first conducting layer; (2) a first dielectric layer formed above the first conducting layer and having a feature that exposes a portion of the first conducting layer; (3) a graphitic carbon film disposed on a sidewall of the feature defined by the first dielectric layer and in contact with the first conducting layer at a bottom of the feature; and (4) a second conducting layer disposed above and in contact with the graphitic carbon film. Numerous other aspects are provided.

14 Claims, 5 Drawing Sheets

U.S. PATENT DOCUMENTS

| | | |
|---|---|---|
| 7,575,984 B2 | 8/2009 | Radigan et al. |
| 2003/0073295 A1 | 4/2003 | Xu |
| 2003/0151077 A1 | 8/2003 | Mathew et al. |
| 2004/0026730 A1 | 2/2004 | Kostylev et al. |
| 2004/0251551 A1 | 12/2004 | Hideki |
| 2005/0089467 A1 | 4/2005 | Grill et al. |
| 2006/0022347 A1 | 2/2006 | Campbell |
| 2006/0158760 A1 | 7/2006 | Portico Ambrosio et al. |
| 2006/0170058 A1 | 8/2006 | Chiang et al. |
| 2006/0250836 A1 | 11/2006 | Herner et al. |
| 2006/0250837 A1* | 11/2006 | Herner et al. ............ 365/148 |
| 2006/0263289 A1 | 11/2006 | Heo et al. |
| 2007/0045691 A1 | 3/2007 | Chang et al. |
| 2007/0069217 A1 | 3/2007 | Herner |
| 2007/0087508 A1 | 4/2007 | Herner |
| 2007/0158697 A1 | 7/2007 | Choi et al. |
| 2007/0190722 A1 | 8/2007 | Herner |
| 2007/0205792 A1 | 9/2007 | Mouli et al. |
| 2008/0002481 A1 | 1/2008 | Gogl et al. |
| 2008/0070162 A1* | 3/2008 | Ufert ............ 430/290 |
| 2008/0157257 A1 | 7/2008 | Bertin et al. |
| 2008/0169531 A1 | 7/2008 | Huo et al. |
| 2008/0211101 A1 | 9/2008 | Han et al. |
| 2008/0217732 A1* | 9/2008 | Kreupl ............ 257/528 |
| 2008/0283813 A1 | 11/2008 | Jeong |
| 2009/0166609 A1 | 7/2009 | Schricker et al. |
| 2009/0166610 A1 | 7/2009 | Schricker et al. |
| 2009/0168491 A1 | 7/2009 | Schricker et al. |
| 2009/0201715 A1 | 8/2009 | Kreupl |
| 2009/0257270 A1 | 10/2009 | Schricker et al. |
| 2009/0321706 A1 | 12/2009 | Happ et al. |
| 2010/0006811 A1 | 1/2010 | Xu et al. |

FOREIGN PATENT DOCUMENTS

| | | |
|---|---|---|
| JP | 2008 078509 A | 4/2008 |
| WO | WO 2007114655 | 10/2007 |
| WO | WO 2008/021900 A | 2/2008 |
| WO | WO 2009/064842 A1 | 5/2009 |

OTHER PUBLICATIONS

Xu et al., U.S. Appl. No. 12/505,122, filed Jul. 17, 2009.
Xu et al., U.S. Appl. No. 12/465,315, filed May 13, 2009.
Xu et al., U.S. Appl. No. 12/499,467, filed Jul. 8, 2009.
Malhi et al., "Characteristics and Three-Dimensional Integration of MOSFET's in Small-Grain LPCVD Polycrystalline Silicon," IEEE Journal of Solid-State Circuits, vol. SC-20, No. 1, Feb. 1985, pp. 178-201.
Scheuerlein et al., U.S. Appl. No. 12/418,855, filed Apr. 6, 2009.
Chen et al., "Effects of deposition temperature on the properties of hermetically carbon-coated optical fibers prepared by thermal chemical vapor deposition," Surface and Coatings Technology, vol. 202, Issues 4-7, Dec. 15, 2007, pp. 798-803.
Schricker et al., U.S. Appl. No. 12/421,823, filed Apr. 10, 2009.
Son et al., "Electrical Switching in Metallic Carbon Nanotubes," Physical Review Letters, vol. 95, Issue 21, id 216602, 2005, pp. 1-4.
Li et al., "Bottom-up approach for carbon nanotube interconnects," Applied Physics Letters, vol. 82, No. 15, Apr. 14, 2003, pp. 2491-2493.
International Search Report and Written Opinion of International Application No. PCT/US2009/040128 mailed Aug. 4, 2009.

* cited by examiner

DAMASCENE INTEGRATION METHODS FOR GRAPHITIC FILMS IN THREE-DIMENSIONAL MEMORIES AND MEMORIES FORMED THEREFROM

REFERENCE TO RELATED APPLICATIONS

This application claims priority from U.S. Provisional Patent Application Ser. No. 61/044,352, filed 11 Apr. 2008, which is incorporated by reference herein in its entirety for all purposes.

FIELD OF THE INVENTION

The present application relates to microelectronic devices, such as non-volatile memories, and more particularly to damascene integration methods for graphitic films in three-dimensional memories and memories formed therefrom.

BACKGROUND

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 application"), which is hereby incorporated by reference herein in its entirety for all purposes, describes a rewriteable non-volatile memory cell that includes a diode coupled in series with a reversible resistivity-switching material such as a metal oxide or metal nitride.

In addition, U.S. patent application Ser. No. 11/968,154, filed Dec. 31, 2007, titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME" (hereinafter "the '154 application"), which is hereby incorporated by reference herein in its entirety for all purposes, describes a rewriteable non-volatile memory cell that includes a diode coupled in series with a carbon-based reversible resistivity-switching material such as carbon nano-tubes.

However, fabricating memory devices from rewriteable resistivity-switching materials is technically challenging, and improved methods of forming memory devices that employ resistivity-switching materials are desirable.

SUMMARY

In some aspects of the invention, a microelectronic structure is provided that includes (1) a first conducting layer; (2) a first dielectric layer formed above the first conducting layer and having a feature that exposes a portion of the first conducting layer; (3) a graphitic carbon film disposed on a sidewall of the feature defined by the first dielectric layer and in contact with the first conducting layer at a bottom of the feature; and (4) a second conducting layer disposed above and in contact with the graphitic carbon film.

In other aspects of the invention, a memory cell is provided that includes (1) a first conductor; (2) a reversible resistance-switching element formed above the first conductor having (a) a feature having a sidewall; and (b) a graphitic carbon film formed on the sidewall of the feature. The memory cell further includes (3) a steering element formed above the first conductor; and (4) a second conductor formed above the reversible resistance-switching element and the steering element.

In yet other aspects of the invention, a method of forming a microelectronic structure is provided that includes (1) forming a first conducting layer; (2) forming a first dielectric layer above the first conducting layer; (3) forming a feature in the first dielectric layer so as to expose a portion of the first conducting layer; (4) forming a graphitic carbon film on a sidewall of the feature, the graphitic carbon film being in contact with the first conducting layer at a bottom of the feature; (5) planarizing the microelectronic structure to co-expose the graphitic carbon film and the first dielectric layer; and (6) forming a second conducting layer disposed above and in contact with the graphitic carbon film. Numerous other aspects are provided.

Other features and aspects of this invention will become more fully apparent from the following detailed description, the appended claims and the accompanying drawings.

BRIEF DESCRIPTION OF THE DRAWINGS

A more particular understanding of the invention may be obtained by reference to the described embodiments thereof that are illustrated in the appended drawings. The appended drawings illustrate only typical embodiments of this invention, they are not intended to be scale, and they are not to be considered limiting of its scope, for the invention may admit to other effective embodiments.

To facilitate understanding, similar reference numerals have been used, where possible, to designate similar elements that are common to the figures.

DETAILED DESCRIPTION

Graphitic carbon (GC) films may exhibit reversible resistivity-switching properties, making these films a candidate for integration within a three-dimensional memory array. However, film orientation and thickness may affect the switching characteristics of a GC film. For example, when conduction occurs along the length of the carbon pi bonds of a GC film (parallel to the plane of the film), switching may be observed.

In accordance with one or more embodiments of the invention, novel integration schemes are provided that allow GC films to be employed with an orientation that supports reversible resistivity-switching. For example, in some embodiments, a damascene approach may be employed to provide GC films of a suitable "switching" orientation as described below with reference to FIGS. 1-7.

In some embodiments of the invention, thin GC films may be integrated in series with a steering element, such as a (vertical) diode to create a re-writable memory device. To achieve this, a GC film may be vertically oriented between two metal layers or conductors, instead of horizontally oriented between two metal layers or conductors (e.g., such as in a metal-insulator-metal (MIM) planar stack). As such, at least a portion of the graphitic carbon film is disposed in line with a conduction path between the two conductors.

As used herein, a "graphitic carbon film" or a "GC film" may refer to any carbon-based material that includes graphitic carbon including, for example, graphene, carbon nanotubes (CNTs), amorphous carbon with graphene (e.g., amorphous carbon with regions of $sp^2$ bonded carbon), or the like.

With reference to FIGS. 1-4, an exemplary damascene process is provided in accordance with the present invention. The exemplary damascene process forms a microelectronic structure 100 that may be used as a portion of a non-volatile memory cell (as described further below). The microelectronic structure 100 may be considered a variation of a metal-insulator-metal (MIM) structure.

Figure 1:
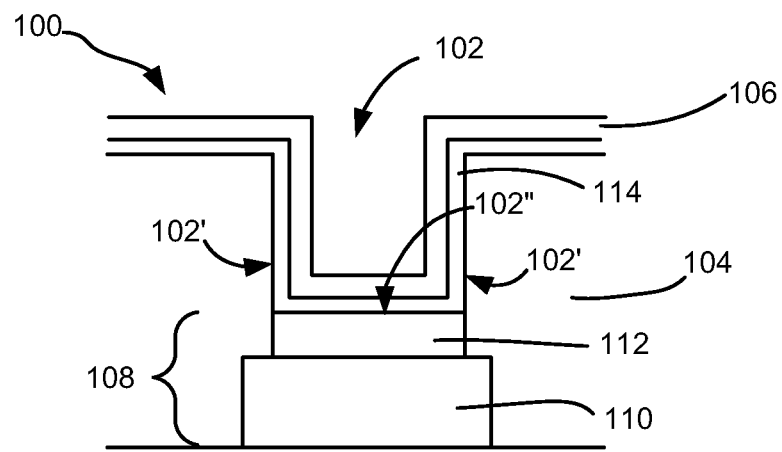
FIGS. 1-4 depict cross-sectional, front elevational schematic diagrams of intermediate stages of an exemplary memory cell in accordance with an embodiment of the present invention, the memory cell comprising a metal-insulator-metal structure formed by damascene integration.

FIG. 1 depicts the microelectronic structure 100 at an early stage of formation, after a trench, via or similar feature 102 is created in a first insulating material 104. The feature 102 is defined in part by sidewalls 102', corresponding to the first insulating material 104, and a bottom 102", corresponding to a bottom electrode. The first insulating material 104 may be, for example, silicon dioxide, silicon nitride, a low k dielectric, etc. Graphitic carbon (GC) material 106 is deposited in the feature 102. For example, a GC film 106 may be deposited on the sidewall and bottom regions 102', 102" of the feature 102, as well as on the (top) field regions of the first insulating material 104. Exemplary feature widths are about 20-130 nanometers and exemplary feature heights are about 0.1-2.6 microns, although other sizes may be used.

In some embodiments, to create the via, trench or similar feature 102 in the insulating material 104, a sacrificial layer of germanium, amorphous carbon or otherwise controllably etchable material is deposited, patterned and etched into a pillar (not shown). In some embodiments, the sacrificial layer may have a thickness of about 0.1-2.6 microns, although other thicknesses may be used. For example, the pillar may be formed over a first conductor 108 which may include, for example, a tungsten or similar first conductive layer 110 and/or a TiN, TaN, WN, Mo, or similar barrier/adhesion layer 112. The first conductor 108 may serve as a bottom electrode for an MIM stack including the GC film 106. Insulating material 104 is subsequently deposited around the sacrificial germanium pillar and planarized by an etch back process, chemical mechanical polishing (CMP) or the like. The insulating material 104 may be stoichiometric or non-stoichiometric $SiO_2$, $Si_3N_4$, or any other suitable insulating and/or dielectric material. After planarization, the sacrificial germanium pillar may be removed with an ashing or other etching technique to generate a void that is the feature 102 in the insulating material 104 (see FIG. 1). Any other technique for forming the feature 102 may be employed.

After the feature 102 is formed, the GC film 106 is deposited. The GC film 106 may be deposited by any suitable technique such as Chemical Vapor Deposition (CVD), High Density Plasma (HDP) deposition, plasma enhanced CVD, sputter deposition from an amorphous or graphite target, etc. In some embodiments, post deposition treatment(s) may be employed such as annealing in reduced pressure or oxygen environments to affect or otherwise improve the properties of the GC film 106. To improve sidewall coverage, a conformal deposition process may be used in one or more embodiments.

In one exemplary embodiment, a GC film thickness of about one monolayer to about 1000 angstroms, and more preferably about 50 angstroms to about 600 angstroms, at the sidewalls 102' of the feature 102 may be employed. Other thicknesses may be used. In some embodiments, however, the GC film 106 thickness may completely fill the feature 102, leaving no space or vacancy for further dielectric filler.

In these or other embodiments, the interface 114 between the GC film 106 and the insulating material 104, such as at the sidewalls 102' of the feature 102, may be modified to improve adhesion between the GC film 106 and the insulating material 104. For example, GC material deposition parameters may be adjusted so that a thin region (represented by interface 114) of the GC film 106, such as a few monolayers, in contact with the insulating material 104 is $sp^3$ rich rather than $sp^2$ rich (as may be preferred for the remainder of the GC film 106 in some embodiments). For example, if the GC film 106 is formed using plasma-enhanced chemical vapor deposition (PECVD), process temperature may be lowered and/or plasma ionization may be increased during film formation to increase the $sp^3$ concentration of the resultant film as described, for example, in U.S. Provisional Patent Application Ser. No. 61/078,911, filed Jul. 8, 2008 and titled "CARBON-BASED INTERFACE LAYER FOR A MEMORY DEVICE AND METHODS OF FORMING THE SAME", which is hereby incorporated by reference herein in its entirety for all purposes (hereinafter "the '911 application"). The '911 application also describes improved adhesion by increasing film density at least in the interface region. Increased film density may be achieved by reducing deposition rate and/or increasing surface ion bombardment. Further, the '911 application discloses that adhesion between a C-based switching layer and another layer (e.g., a conductive or dielectric layer) may be improved with a C-based interface layer formed by nitridizing a C-based material layer.

Additionally or alternatively, a thin "capping" layer (also represented by interface 114) of ALD, CVD or PECVD silicon dioxide, silicon nitride, etc., may be deposited between the GC film 106 and the insulating material 104 to improve adhesion. Exemplary capping layer thicknesses are about 50-800 angstroms, although other thickness ranges may be used. In such embodiments, any capping layer formed over the barrier/adhesion layer 112 may be removed prior to formation of the GC film 106.

In some embodiments, adhesion of the GC film 106 may be improved by reducing interlayer stress at the interfaces. For example, interlayer stress at the interface of a carbon-based material and a conductive material may be reduced by changing the conductive material employed or reducing the volume of the conductive material relative to that of the carbon-based material, as described in U.S. Provisional Patent Application Ser. No. 61/108,017, filed Oct. 23, 2008 and titled "METHODS AND APPARATUS EXHIBITING REDUCED DELAMINATION OF CARBON-BASED RESISTIVITY-SWITCHING MATERIALS", which is hereby incorporated by reference herein in its entirety for all purposes (hereinafter "the '017 application"). The '017 application also discloses use of a separation layer to reduce interlayer stress, such as an additional adhesion layer, like titanium carbide (TiC), to separate the surface of the conductive material and the carbon-based material. The volume of the conductive material relative to that of the carbon-based material may be reduced, for example, by reducing the thickness of the conductive material, etching the conductive material prior to forming the carbon-based material, and/or etching the carbon-based material to extend beyond the conductive material. In addition, the '017 application discloses improving adhesion with an anneal to evaporate any residual water remaining from previous processing.

In some embodiments in accordance with this invention, following deposition/formation of the GC film 106, an anneal step may be performed to modify the properties of the GC film 106. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

This anneal may be performed prior to the formation of additional layers, such as capping oxide or dielectric, above the GC film 106. A queue time of preferably about 2 hours between the anneal and the additional layer deposition preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

While not wanting to be bound by any particular theory, it is believed that the GC material may absorb water from the air over time. Likewise, it is believed that the moisture may increase the likelihood of delamination of the GC material. In some cases, it also might be acceptable to have a queue time of 2 hours from the time of GC material formation to dielectric deposition, skipping the anneal altogether. As a result, in some embodiments, delamination of the GC film 106 and/or top electrode material from a substrate is less likely to occur if the GC film 106 is annealed prior to formation of the top electrode over the GC material.

Incorporation of such a post-GC-formation anneal preferably takes into account other layers present on the device that includes the GC material, inasmuch as these other layers will also be subject to the anneal. For example, the anneal may be omitted or its parameters may be adjusted where the aforementioned preferred anneal parameters would damage the other layers. The anneal parameters may be adjusted within ranges that result in the removal of moisture without damaging the layers of the annealed device. For instance, the temperature may be adjusted to stay within an overall thermal budget of a device being formed. Likewise, any suitable forming gases, temperatures and/or durations may be used that are appropriate for a particular device. In general, such an anneal may be used with any c-based layer or carbon-containing material, such as layers having CNT material, graphite, graphene, amorphous carbon, etc.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

Figure 2:
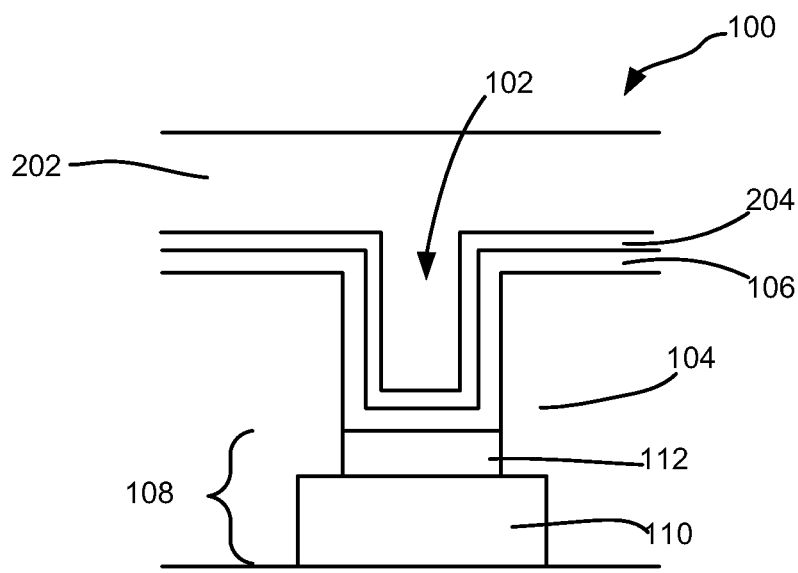

FIG. 2 depicts the microelectronic structure 100 after formation of a second dielectric or other insulating material 202. For example, following formation of the GC film 106, a second dielectric or other insulating material 202 is deposited onto the GC film 106 to fill any remaining vacancy in the feature 102, e.g., the remainder of the trench or via, as shown in FIG. 2. The second dielectric material 202 may be deposited by Chemical Vapor deposition (CVD), High Density Plasma (HDP) deposition, spin-on techniques or the like. The second dielectric material 202 may be stoichiometric or non-stoichiometric $SiO_2$, $Si_3N_4$, any combination thereof, or any other suitable dielectric or insulating material. In particular, use of silicon nitride as the second dielectric material 202 may reduce a risk of potential damage to the GC film 106 believed to occur during deposition of oxide dielectric material.

Standard plasma enhanced chemical vapor deposition (PECVD) techniques for depositing oxide dielectric material may employ an oxygen plasma component which is created in the initial stages of deposition. This initial oxygen plasma may harm the GC material 106, possibly causing poor electrical performance. To avoid this oxygen plasma exposure, the second dielectric material may be formed with a different deposition chemistry (e.g., without a high oxygen component) to protect the GC material 106. Alternatively, the second dielectric material 202 may include a non-oxide dielectric material deposited as a thin layer (not separately shown), such as $Si_3N_4$, to cap the GC film 106, after which additional gap-fill dielectric (e.g., $SiO_2$) is deposited.

As with the interface with the first insulating material 104, in these or other embodiments, the interface between the GC film 106 and the second insulating material 202 may be modified to improve adhesion between the GC film 106 and the insulating material 202. For example, GC material deposition parameters may be adjusted so that a thin region (represented by thin layer 204) of the GC film 106, such as a few monolayers, in contact with the insulating material 202 is $sp^3$ rich rather than $sp^2$ rich (as may be preferred for the remainder of the GC film 106 in some embodiments). Additionally or alternatively, a thin "capping" layer (also represented by thin layer 204) of ALD, CVD or PECVD silicon dioxide, silicon nitride, etc., may be deposited between the GC film 106 and the insulating material 202 to improve adhesion. Exemplary capping layer thicknesses are about 50-800 angstroms, although other thickness ranges may be used. Any of the other described techniques for improving adhesion also may be used.

Figure 3:
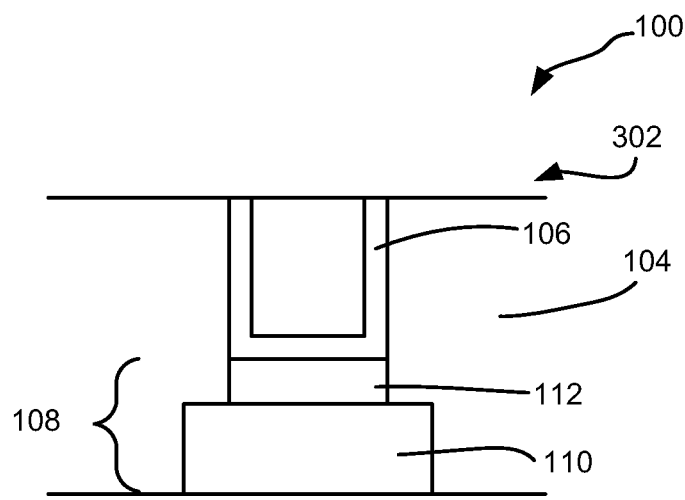

FIG. 3 depicts the microelectronic structure 100 after a planar surface 302 has been formed. Subsequent to deposition of the second insulating material 202, chemical mechanical polishing (CMP) or etch back may be employed to remove the excess second dielectric material 202 and the GC film 106 from the field region of the first dielectric material 104, forming a planar surface 302 for the structure 100, and exposing the GC film 106 on the sidewalls of the feature 102, as shown in FIG. 3. In general, excess deposited GC material, such as GC material on the field region of the first insulating material 104, may be removed by etch back, CMP or any suitable process. In this manner, only the sidewalls and/or the bottom of the feature 102 are coated with the GC film 106.

Figure 4:
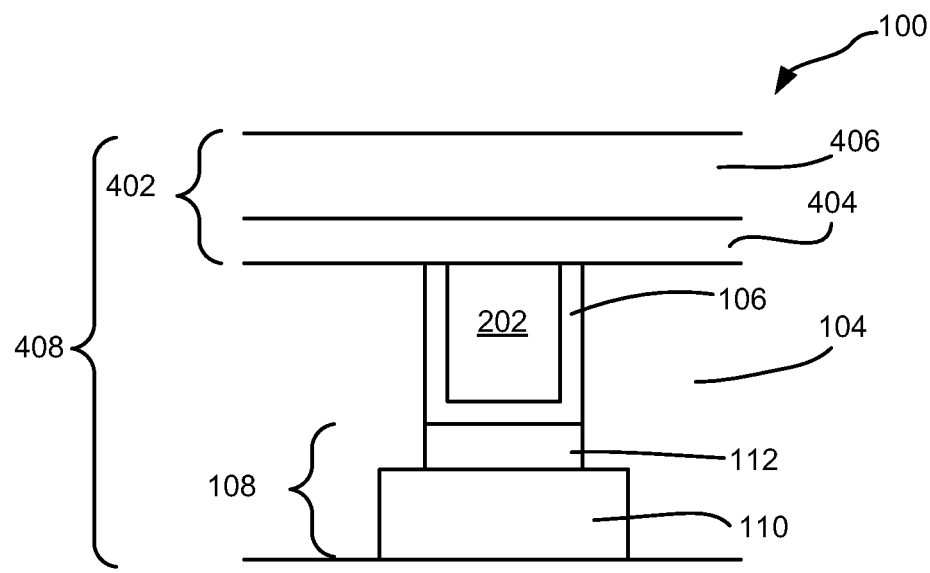

FIG. 4 depicts the microelectronic structure 100 after formation of a second, top conductor 402. Following planarization of the structure, a second, top conductor 402 may be formed over the exposed GC film 106. For example, the second conductor 402 may include, a TiN, TaN, WN, Mo or similar barrier/adhesion layer 404 formed over the GC film 106, and a tungsten or similar metal or conductive layer 406 formed over the barrier/adhesion layer 404. The barrier/adhesion layer 404 and conductive layer 406 then may be patterned and etched to form the second conductor 402. In at least one embodiment, the first and second conductors 108, 402 may be rail conductors that extend in different directions (e.g., substantially perpendicular).

In this manner, a metal-graphitic carbon-metal (MGCM) structure 408 is formed as an example of an MIM. The second conductor 402 may serve as a top electrode for MGCM 408, e.g., the MIM including the GC film 106. Within the MGCM structure 408, conduction between the conductors 108, 402 may occur along vertically oriented portions of the GC material that coats the sidewalls 102' of the feature 102. As such, conduction may occur along the length of the carbon pi bonds of the GC film 106, and resistivity switching may be observed. Further, such a structure 408 reduces the likelihood of an inadvertent vertical short between the top and bottom conductors 108, 402.

In accordance with one or more embodiments of the invention, vertically oriented GC material may be employed within memory cells of a memory array. For example, the MGCM structure 408, or a similar GC-based resistivity switching element, may be placed in series with a steering element to form a memory cell 500 as shown in FIG. 5.

Figure 5:
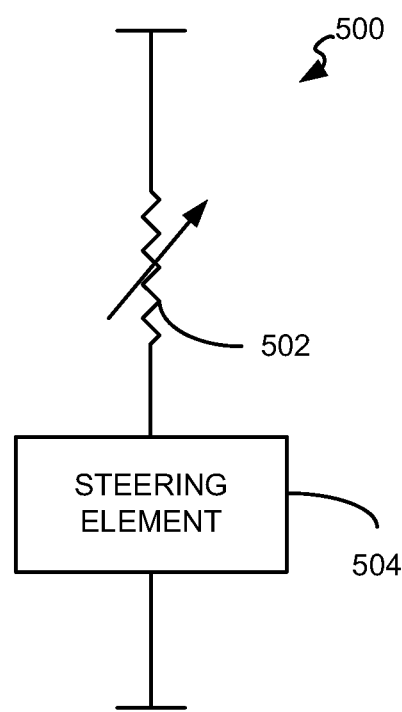
FIG. 5 depicts a schematic diagram of an exemplary memory cell in accordance with embodiments of the present invention, the memory cell comprising a memory element in series with a steering element.

FIG. 5 is a schematic illustration of an exemplary memory cell 500 provided in accordance with the present invention. The memory cell 500 includes a memory element 502, such as a GC-based, reversible resistance-switching element like that shown in FIG. 4, coupled to a steering element 504.

The reversible resistance-switching element 502 includes a reversible resistivity-switching material (not separately shown) having a resistance that may be reversibly switched between two or more states. For example, the reversible resistivity-switching material (e.g., a GC film) of the element 502 may be in an initial, low-resistivity state upon fabrication that is switchable to a high-resistivity state upon application of a first voltage and/or current. Application of a second voltage and/or current may return the reversible resistivity-switching material to a low-resistivity state. Alternatively, the reversible resistance-switching element 502 may be in an initial, high-resistance state upon fabrication that is reversibly switchable to a low-resistance state upon application of the appropriate voltage(s) and/or current(s). When used in a memory cell, one resistance state may represent a binary "0," while another resistance state may represent a binary "1," although more than two data/resistance states may be used. In some embodiments, the reversible resistivity-switching material may be a vertically oriented GC film (as previously described).

The steering element 504 may include a thin film transistor, a tunnel junction, a diode, or another suitable steering element that exhibits non-ohmic conduction by selectively limiting the voltage across and/or the current flow through the reversible resistance-switching element 502. In this manner, the memory cell 500 may be used as part of a two or three dimensional memory array, and data may be written to and/or read from the memory cell 500 without affecting the state of other memory cells in the array, as illustrated in FIG. 6.

Figure 6:
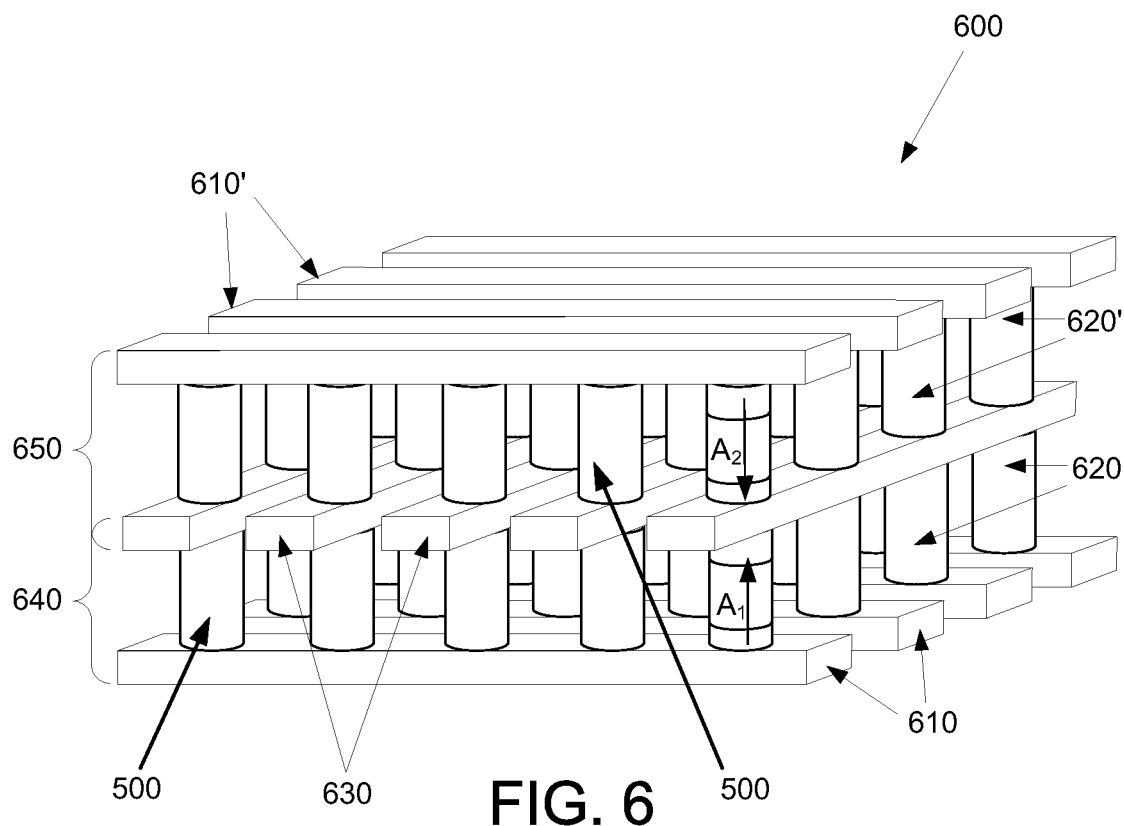
FIG. 6 is a perspective view of two exemplary memory levels of a monolithic three dimensional memory array provided in accordance with the present invention.

FIG. 6 is a perspective view of two exemplary memory levels of a monolithic three dimensional memory array 600 provided in accordance with the present invention. Interconnects may be fabricated to connect each memory cell (e.g., a steering element in series with graphitic carbon) to read/write (R/W) circuitry.

As stated, memory cell operation may be based on a bi-stable resistivity change in the GC material with the application of high bias voltage (>4 V). Current through the memory cell may be modulated by the resistivity of the GC material. The memory cells are read at a lower voltage that will not change the resistivity of the GC material. In some embodiments, the difference in resistivities between the two states may be over 100×. The cell is changed from a "0" to a "1" with the application of high forward bias on the steering element. The cell is changed back from a "1" to a "0" with the application of a high forward bias.

In particular, FIG. 6 shows a portion of a memory array 600 of exemplary memory cells 500 formed according to the fourth exemplary embodiment of the present invention. Memory array 600 may include first conductors 610, 610' that may serve as wordlines or bitlines, respectively; pillars 620, 620' (each pillar 620, 620' comprising a different memory cell 500); and second conductors 630, that may serve as bitlines or wordlines, respectively. First conductors 610, 610' are depicted as substantially perpendicular to second conductors 630. Memory array 600 may include one or more memory levels. A first memory level 640 may include the combination of first conductors 610, pillars 620 and second conductors 630, whereas a second memory level 650 may include second conductors 630, pillars 620' and first conductors 610'. Exemplary methods of forming such memory levels are described, for example, in U.S. Pat. No. 6,952,030, "High-density three-dimensional memory cell" and/or U.S. patent application Ser. No. 11/692,151, filed Mar. 27, 2007 and titled "LARGE ARRAY OF UPWARD POINTING P-I-N DIODES HAVING LARGE AND UNIFORM CURRENT", each of which is hereby incorporated by reference herein in its entirety for all purposes.

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167. The substrates may be thinned or removed from the memory levels before bonding, but as the memory levels are initially formed over separate substrates, such memories are not true monolithic three dimensional memory arrays.

Figure 7:
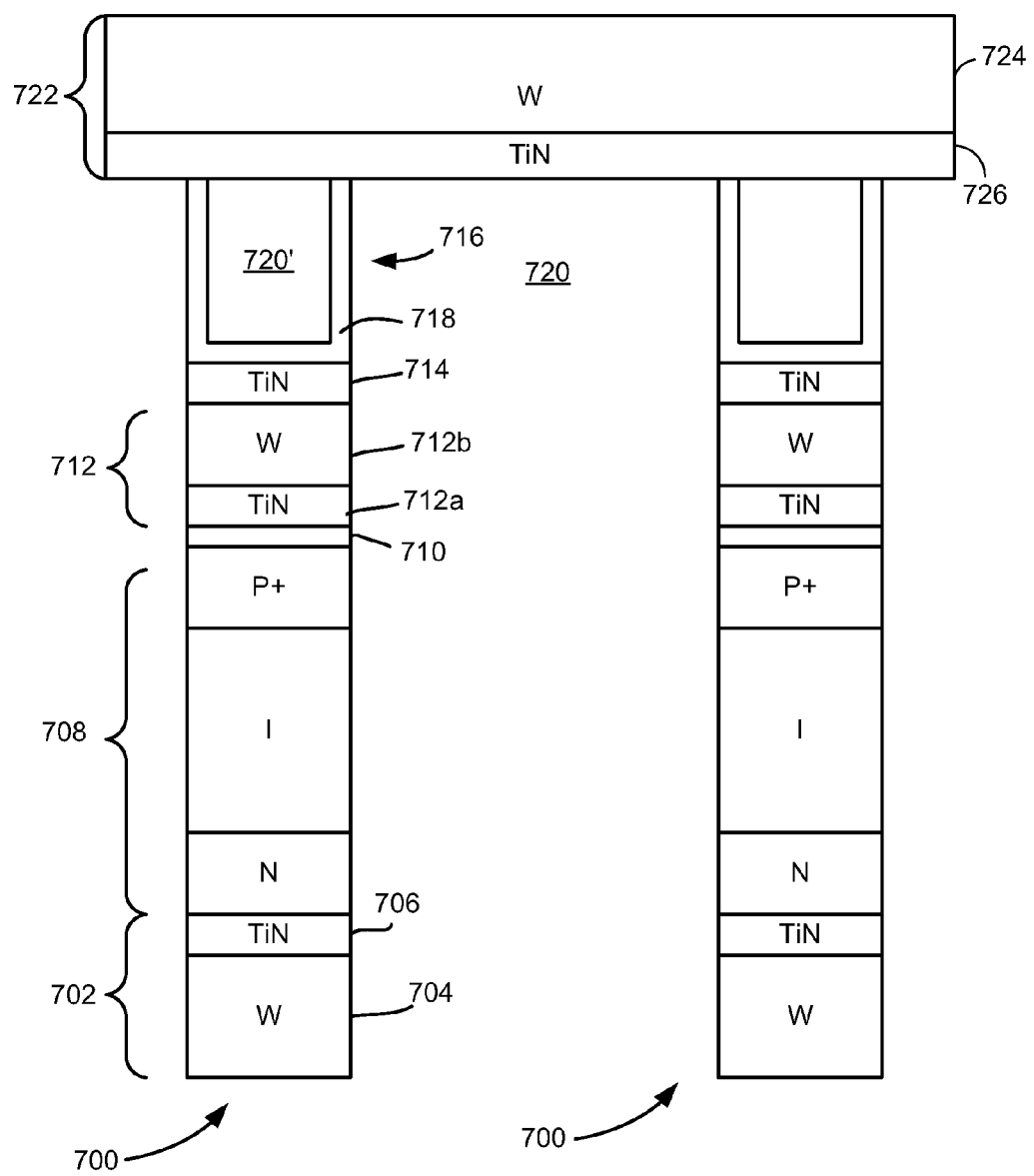
FIG. 7 is a cross-sectional side elevational view of a plurality of exemplary memory cells formed in accordance with the present invention.

FIG. 7 is a cross-sectional view of a plurality of exemplary memory cells 700 formed in accordance with the present invention. With reference to FIG. 7, a first rail conductor 702 is formed above a substrate (not shown). For example, the first conductor 702 may include a tungsten or other conductive layer 704 with or without a TiN, TaN, WN, Mo, or other adhesion/barrier layer 706. A vertical P-I-N (or N-I-P) diode 708, such as a deposited polysilicon or other polycrystalline semiconductor diode, is formed above first conductor 702, as is a silicide region 710 and a metal hard mask 712.

As described in U.S. Pat. No. 7,176,064, "MEMORY CELL COMPRISING A SEMICONDUCTOR JUNCTION DIODE CRYSTALLIZED ADJACENT TO A SILICIDE," which is hereby incorporated by reference herein in its entirety for all purposes, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer 710 enhances the crystalline structure of the diode 708 during annealing). Lower resistivity silicon thereby is provided. Similar results may be achieved for silicon-germanium alloy and/or germanium diodes. Use of metal hard masks are described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 application") which is hereby incorporated by reference herein in its entirety for all purposes. The metal hard mask 712 may include, for example, a barrier layer 712*a* such as TiN, TaN, WN, etc., and/or conductive layer 712*b* such as W or another conductive layer, and may serve as a hard mask during formation of the diode 708.

A TiN, TaN, WN, Mo, or other adhesion/barrier layer 714 is formed above the metal hard mask 712. A via, trench, or similar feature 716 having a GC film 718 formed along the sidewalls and/or bottom of the feature 716 is formed above the adhesion/barrier layer 714. The feature 716 is defined by a first insulating material 720, which serves as gap fill material around each memory cell 700, and is filled with a second insulating material 720', as previously described. (See, for example, FIGS. 1-4 and the accompanying description for exemplary fabrication steps, material types and/or thicknesses, etc.)

In some embodiments, the barrier layer 714, hard mask 712 and diode 708 may be etched together to form pillar structures, and dielectric material 720 may be deposited on top of and around the pillar structures so as to isolate the pillar structures from one another. A CMP or dielectric etchback step then is performed to planarize the dielectric material 720 and remove the dielectric material from the top of the barrier layer 714. Thereafter, a sacrificial layer of germanium, amorphous carbon or otherwise controllably etchable material is deposited over the dielectric material 720, patterned and etched into a pillar (as previously described). For example, the sacrificial pillar may be formed over barrier layer 714. Insulating material 720 may be subsequently deposited around the sacrificial germanium pillar and planarized by an etch back process, chemical mechanical polishing (CMP) or the like. After planarization, the sacrificial germanium pillar may be removed with an ashing or other etching technique to generate a void that is the feature 716 in the insulating material 720. After the feature 716 is formed, the GC film 718 is deposited.

In an alternative embodiment, the sacrificial layer may be deposited before the barrier layer 714, hard mask 712 and diode 708 are patterned and etched. In this manner, the sacrificial layer may be patterned and etched with the barrier layer 714, hard mask 712 and diode 708. Dielectric material 720 then may be deposited on top of and around the resulting pillar structures so as to isolate the pillar structures from one another. A CMP or dielectric etchback step then is performed to planarize the dielectric material 720 and remove the dielectric material from the top of the sacrificial layer. After planarization, the sacrificial germanium pillar may be removed with an ashing or other etching technique to generate a void that is the feature 716 in the insulating material 720. After the feature 716 is formed, the GC film 718 is deposited.

Following formation of the GC film 718, second dielectric or other insulating material 720' is deposited onto the GC film 718 to fill any remaining vacancy in the feature 716. Thereafter, chemical mechanical polishing (CMP) or etch back process may be employed to remove the excess second dielectric material 720' and the GC film 718 from the field region of the first dielectric material 720, forming a planar surface, and exposing the GC film 718 on the sidewalls of the feature 716.

Thereafter, a top conductor 722 is formed above and in contact with the GC film 718, along the planar surface co-exposing GC film 718 and insulating materials 720, 720'. For example, the top conductor 722 may include a tungsten or other conductive layer 724 without or without a TiN, TaN, WN, Mo, or other adhesion/barrier layer 726.

Each memory cell 700 includes a steering element, such as diode 708, in series with a reversible resistance-switching element such as an MIM structure that includes GC film 718 sandwiched between adhesion/barrier layers 714, 726, for example. In some embodiments, the MIM structure may be positioned below the steering element.

As stated, a "graphitic carbon film" or a "GC film" may refer to any carbon-based material that includes graphitic carbon including, for example, graphene, carbon nanotubes (CNTs), amorphous carbon with graphene (e.g., amorphous carbon with regions of $sp^2$ bonded carbon), or the like.

The foregoing description discloses only exemplary embodiments of the invention. Modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claims is:

1. A microelectronic structure comprising:
   a first conducting layer;
   a first dielectric layer formed above the first conducting layer and having a feature that exposes a portion of the first conducting layer;
   a graphitic carbon film disposed on a sidewall of the feature defined by the first dielectric layer and in contact with the first conducting layer at a bottom of the feature, wherein the graphitic carbon film comprises $sp^2$ rich carbon;
   an interface region between the sidewall of the feature and the graphitic carbon film, wherein the interface region comprises an $sp^3$ rich carbon-based material; and
   a second conducting layer disposed above and in contact with the graphitic carbon film.

2. The microelectronic structure of claim 1, further comprising:
   a second dielectric material disposed on the graphitic carbon film and within the feature.

3. The microelectronic structure of claim 2, wherein the second dielectric material comprises silicon nitride or silicon dioxide.

4. The microelectronic structure of claim 1, wherein the graphitic carbon film is a conformal graphitic carbon film.

5. The microelectronic structure of claim 4, wherein the graphitic carbon film has a thickness of about 1000 angstroms or less.

6. The microelectronic structure of claim 1, wherein the feature has a width of about 130 nanometers or less.

7. The microelectronic structure of claim 1, wherein the first conducting layer, graphitic carbon film and second conducting layer form a reversible resistance-switching element.

8. The microelectronic structure of claim 7, wherein at least one of the first and second conducting layers comprises a metal nitride.

9. A memory cell comprising:
   a first conductor;
   a reversible resistance-switching element formed above the first conductor including:
   a feature having a sidewall; and
   a graphitic carbon film formed on the sidewall of the feature, wherein the graphitic carbon film comprises $sp^2$ rich carbon;
   an interface region between the sidewall of the feature and the graphitic carbon film, wherein the interface region comprises an $sp^3$ rich carbon-based material;
   a steering element formed above the first conductor; and
   a second conductor formed above the reversible resistance-switching element and the steering element.

10. The memory cell of claim 9, wherein the feature comprises an opening in a dielectric layer.

11. The memory cell of claim 10, wherein the opening has a width of about 130 nanometers or less.

12. The memory cell of claim 9, wherein the graphitic carbon film is a conformal film.

13. The memory cell of claim 9, wherein the graphitic carbon film has a thickness of about 1000 angstroms or less.

14. The memory cell of claim 9, wherein the steering element comprises a vertical polysilicon diode.

* * * * *